United States Patent
Nishi et al.

(10) Patent No.: US 6,841,342 B2
(45) Date of Patent: Jan. 11, 2005

(54) SUBSTRATE PROCESSING APPARATUS AND SUBSTRATE PROCESSING METHOD

(75) Inventors: Takanori Nishi, Kikuchi-gun (JP); Eiichi Shirakawa, Kikuchi-gun (JP)

(73) Assignee: Tokyo Electron Limited, Tokyo (JP)

( * ) Notice: Subject to any disclaimer, the term of this patent is extended or adjusted under 35 U.S.C. 154(b) by 174 days.

(21) Appl. No.: 10/212,725

(22) Filed: Aug. 7, 2002

(65) Prior Publication Data

US 2003/0032302 A1 Feb. 13, 2003

(30) Foreign Application Priority Data

Aug. 8, 2001 (JP) ........................................ 2001-240878

(51) Int. Cl.[7] .............................................. G03F 7/38
(52) U.S. Cl. ...................... 430/330; 430/328; 438/758; 118/302; 392/416; 392/418
(58) Field of Search ................ 392/416, 418; 118/302; 430/330, 328; 438/758

(56) References Cited

U.S. PATENT DOCUMENTS

| | | | | |
|---|---|---|---|---|
| 5,685,949 A | * | 11/1997 | Yashima | 438/694 |
| 6,458,430 B1 | * | 10/2002 | Bernstein et al. | 427/525 |
| 6,686,132 B2 | * | 2/2004 | Cheng et al. | 430/325 |
| 2002/0123011 A1 | * | 9/2002 | Kawano et al. | 430/330 |

* cited by examiner

*Primary Examiner*—Mark F. Huff
*Assistant Examiner*—Daborah Chacko-Davis
(74) *Attorney, Agent, or Firm*—Oblon, Spivak, McClelland, Maier & Neustadt, P.C.

(57) ABSTRACT

A substrate processing apparatus for processing a substrate coated with a chemical amplification type resist and subjected to a light-exposure treatment comprises a substrate table on which is disposed a substrate, a heater for heating the substrate disposed on the substrate table, and an electric field forming mechanism for forming an electric field exerting force, which is directed toward the substrate, on the protons generated in the resist formed on the substrate disposed on the substrate table.

30 Claims, 15 Drawing Sheets

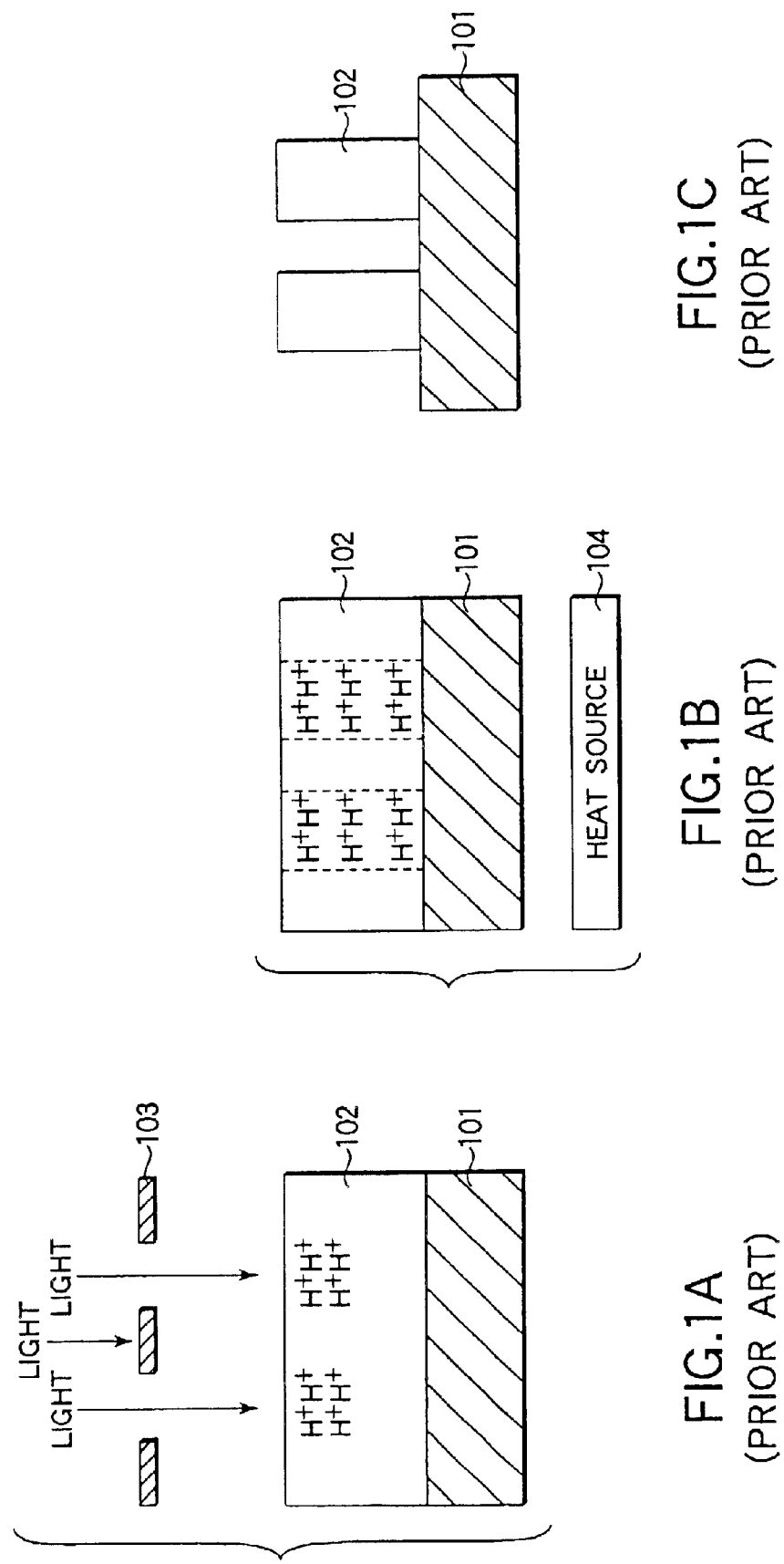

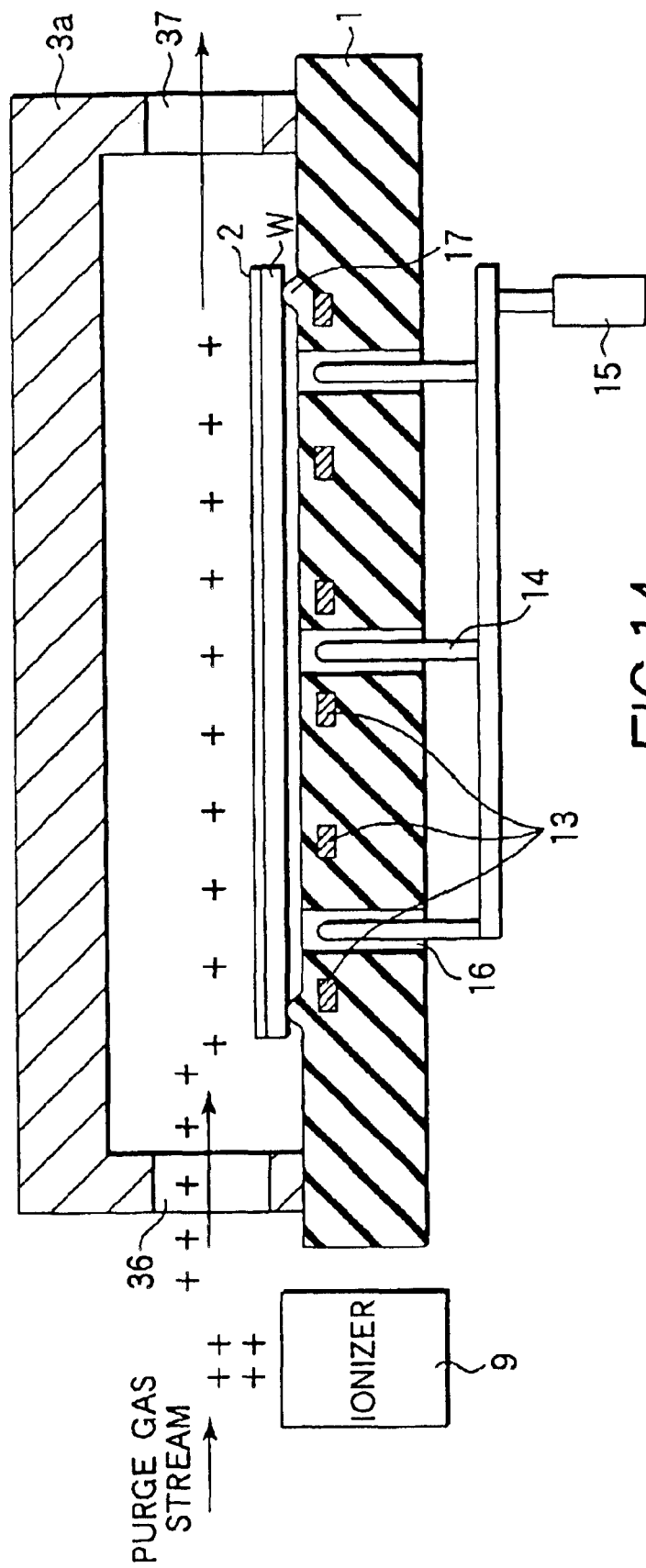

SUBSTRATE PROCESSING APPARATUS AND SUBSTRATE PROCESSING METHOD

BACKGROUND OF THE INVENTION

1. Field of the Invention

The present invention relates to a substrate processing apparatus and a substrate processing method, in which a substrate is coated with a chemical amplification type resist, followed by exposing the resist to light and subsequently processing the substrate before the developing processing.

2. Description of the Related Art

In a photolithography step, which is one of the steps of the semiconductor device manufacturing process, a semiconductor wafer is coated with a thin resist film, followed by exposing the resist film to light in a prescribed pattern and subsequently developing the patterned resist film so as to form a mask pattern. These processes are carried out in general by using a system including a resist coating-developing device, and a light exposure device connected to the resist coating-developing device.

On the other hand, a chemical amplification type resist material is being studied in recent years. In the chemical amplification type resist material, an acid is generated by the light exposure from an acid generating agent contained in the resist material, and the generated acid is diffused by the post-exposure bake so as to act as a catalyst. As a result, an acid catalytic reaction is allowed to proceed. For example, in a positive resist, a decomposition reaction for decomposing the base resin, which is a main component of the resist material, is generated in the portions of the resist corresponding to the light-exposed regions so as to make the portions soluble in a developing solution. On the other hand, in a negative resist, a crosslinking reaction is generated in the portions of the resist corresponding to the light-exposed regions so as to change the molecular structure of the base resin of the resist material, thereby making the portions insoluble in the developing solution. For example, the hydroxyl group of the polymer such as polyvinyl phenol is blocked by an alkyl group or a silyl group, and the block is removed by an acid so as to restore the solubility in an alkali.

FIGS. 1A to 1C show the states of a resist 102 in the light exposure step, the heating and the development step in the case of using a chemical amplification type negative resist. First, in the light exposure step, the resist 102 formed on a substrate 101 is exposed to light by using a mask 103 thereby generating protons ($H^+$), which are an acid, on those surface portions of the resist 102 which were exposed to light. Then, the substrate 101 is heated from the back surface by using a heat source 104, thereby diffusing generated acid, i.e., the proton particles ($H^+$), into the portions of the resist corresponding the light-exposed regions so as to make the light-exposed portions insoluble in the developing solution, as shown in FIG. 1B. After the heating step, the resist 102 is developed, thereby dissolving those portions of the resist 102 which are soluble in the developing solution to form a mask pattern as shown in FIG. 1C.

The use of the resist of this kind is advantageous in that it is possible in principle to comply with a fine line width. Since the developing rate of the chemical amplification type resist is determined by the amount of the acid catalytic reaction, the characteristics of the chemical amplification type resist, particularly, the accuracy in the line width of the mask pattern after the development, are greatly affected by the conditions of the heat treatment after the light exposure.

The heating device for heating the substrate after the light exposure step is constructed such that a substrate is disposed on a heating plate having a resistance heater buried therein, the substrate disposed on the heating plate is covered with a lid so as to form a processing space, and a purge gas stream flowing from, for example, the outward toward the central portion is formed within the processing space.

However, the heating device of the construction described above gives rise to the following problem. Specifically, the acid generated from the sensitizing agent by the exposure to light, i.e., proton ($H^+$), is scattered from the surface portion of the resist 102 in the heating step so as to be diffused into the purge gas, as shown in FIG. 2A. As a result, that surface portion of the negative resist from which the acid of proton ($H^+$) has been scattered remains to be soluble in the developing solution like the portions of the resist corresponding to the unexposed regions, though the particular surface portion, which has been exposed to light, should originally be rendered insoluble in the developing solution by the acid catalytic reaction. It follows that the upper portion of the mask pattern is rendered roundish so as to render poor the accuracy in the line width of the mask pattern as shown in FIG. 2B. On the other hand, in the positive resist, that surface portion from which the acid of proton ($H^+$) has been scattered, remains to be insoluble in the developing solution like the portions of the resist corresponding to the unexposed regions, though the particular surface portion, which has been exposed to light, should originally be rendered soluble in the developing solution by the acid catalytic reaction. It follows that a lateral projection is formed in the upper portion of the mask pattern, i.e., a T-shaped top portion is formed, so as to render poor the accuracy in the line width of the mask pattern as shown in FIG. 2C. It should also be noted that, if the scattered proton ($H^+$) is carried by the purge gas stream so as to be attached again to another portion of the resist, the portion that should originally be rendered soluble is rendered insoluble in the developing solution, or, by contraries, the portion that should originally be rendered insoluble is rendered soluble in the developing solution, so as to lower the accuracy of the pattern.

A TARC (Top Anti-Reflective Coating) treatment in which an antireflective film is coated is known as a means for preventing the acid of proton ($H^+$) from being scattered from the surface portion of the resist film. In the TARC treatment, however, it is difficult to coat uniformly the antireflective film. Also, if the line width is rendered further narrower, it is difficult to obtain a high accuracy of the line width. In addition, the running cost is increased because the coating step is required.

On the other hand, in the post-exposure bake of a chemical amplification type resist, the initial distribution of protons ($H^+$) in the portions of the resist corresponding to the light-exposed regions is not uniform. As a result, it is difficult for the chain reaction to take place uniformly so as to make it difficult to ensure a desired uniformity in the line width. Also, the required heating temperature is high, i.e., 100 to 150° C., in order to permit a sufficient reaction to take place in the portions of the low proton ($H^+$) concentration in the portions of the resist corresponding to the light-exposed regions. The convection is increased with elevation of the temperature, with the result that a turbulence tends to be generated in the processing space so as to make the temperature nonuniform. It should also be noted that, since the initial distribution of the acid of protons (H) is not uniform as described above, it is necessary to set the light exposure amount at a high level so as to prevent the portion where proton ($H^+$) is deficient from being formed, leading to the waste of energy. In addition, an inconvenience such as transpiration of the acid of proton ($H^+$) is brought about as described above. Further, it is desirable to form an appropriate proton (H⁺) distribution conforming to the pattern in the portions of the resist corresponding to the light-exposed regions in order to improve the uniformity of the line width. In the conventional post-exposure bake treatment, however, it is difficult to form an appropriate proton (H⁺) distribution conforming to the pattern.

BRIEF SUMMARY OF THE INVENTION

An object of the present invention is to provide a substrate processing apparatus and a substrate processing method, which permit suppressing the scattering of protons (H⁺), which is an acid generated from the sensitizing agent by the light exposure, from the resist surface in heating the substrate coated with a chemical amplification type resist.

Another object of the present invention is to provide a substrate processing apparatus and a substrate processing method, which permit making uniform the distribution of the acid of protons (H⁺) after the light exposure of the substrate coated with a chemical amplification type resist.

Further, still another object of the present invention is to provide a substrate processing apparatus and a substrate processing method, which permit controlling the distribution of protons (H⁺) after the light exposure of the substrate coated with a chemical amplification type resist.

According to a first aspect of the present invention, there is provided a substrate processing apparatus for processing a substrate coated with a chemical amplification type resist and subjected to a light exposure treatment before the developing processing, comprising a substrate table on which a substrate is disposed, a heater for heating the substrate disposed on said substrate table, and an electric field forming mechanism for forming an electric field in a manner to prevent the protons generated in the resist formed on the substrate disposed on the substrate table from being scattered.

According to a second aspect of the present invention, there is provided a substrate processing apparatus for processing a substrate coated with a chemical amplification type resist and subjected to a light exposure treatment before the developing processing, comprising a substrate table on which a substrate is disposed, a heater for heating the substrate disposed on said substrate table, and an electric field forming mechanism for forming an electric field in a manner to exert force, which is directed toward the substrate, on the protons generated in the resist formed on the substrate disposed on said substrate table.

According to a third aspect of the present invention, there is provided a substrate processing apparatus for processing a substrate coated with a chemical amplification type resist and subjected to a light exposure treatment before the developing processing, comprising a substrate table on which a substrate is disposed, a heater for heating the substrate disposed on said substrate table, and a charge holding member for holding the charge exerting force, which is directed toward the substrate, on the protons generated in the resist formed on the substrate disposed on said substrate table.

According to a fourth aspect of the present invention, there is provided a substrate processing apparatus for processing a substrate coated with a chemical amplification type resist and subjected to a light exposure treatment before the developing processing, comprising a substrate table on which a substrate is disposed, a heater for heating the substrate disposed on said substrate table, and an electric field forming mechanism for forming an electric field in a manner to exert force, which is directed upward, on the protons generated in the resist formed on the substrate disposed on said substrate table.

According to a fifth aspect of the present invention, there is provided a substrate processing apparatus for processing a substrate coated with a chemical amplification type resist and subjected to a light exposure treatment before the developing processing, comprising a substrate table on which a substrate is disposed, a heater for heating the substrate disposed on said substrate table, means for forming a purge gas stream along the substrate disposed on said substrate table, and an ionizer for charging positive said purge gas stream.

According to a sixth aspect of the present invention, there is provided a substrate processing apparatus for processing a substrate coated with a chemical amplification type resist and subjected to a light exposure treatment before the developing processing, comprising a substrate table on which a substrate is disposed, a heater for heating the substrate disposed on said substrate table, and an electric field forming mechanism for forming an electric field capable of controlling the distribution of the protons in the portions of the resist corresponding to the light-exposed regions formed on the substrate disposed on said substrate table.

According to a seventh aspect of the present invention, there is provided a substrate processing apparatus for processing a substrate coated with a chemical amplification type resist and subjected to a light exposure treatment before the developing processing, comprising a substrate table on which a substrate is disposed, and an electric field forming mechanism for forming an electric field capable of moving the protons in the portions of the resist corresponding to the light-exposed regions formed on the substrate disposed on said substrate table.

According to an eighth aspect of the present invention, there is provided a substrate processing method for processing a substrate coated with a chemical amplification type resist and subjected to a light exposure treatment before the developing processing, comprising the steps of transferring a substrate into a substrate table, heating the substrate disposed on said substrate table, and forming an electric field in a manner to prevent the protons generated in the resist formed on the substrate from being scattered while the substrate is being heated.

According to a ninth aspect of the present invention, there is provided a substrate processing method for processing a substrate coated with a chemical amplification type resist and subjected to a light exposure treatment before the developing processing, comprising the steps of transferring a substrate into a substrate table, heating the substrate disposed on said substrate table, and forming an electric field in a manner to exert force, which is directed toward the substrate, on the protons generated in the resist formed on the substrate while the substrate is being heated.

According to a tenth aspect of the present invention, there is provided a substrate processing method for processing a substrate coated with a chemical amplification type resist and subjected to a light exposure treatment before the developing processing, comprising the steps of transferring a substrate into a substrate table, heating the substrate disposed on said substrate table, and forming an electric field in a manner to exert force, which is directed upward, on the protons generated in the resist formed on the substrate while the substrate is being heated.

According to an eleventh aspect of the present invention, there is provided a substrate processing method for processing a substrate coated with a chemical amplification type resist and subjected to a light exposure treatment before the developing processing, comprising the steps of transferring a substrate into a substrate table, heating the substrate disposed on said substrate table, forming a purge gas stream along the substrate, and charging positive said purge gas stream.

According to a twelfth aspect of the present invention, there is provided a substrate processing method for processing a substrate coated with a chemical amplification type resist and subjected to a light exposure treatment before the developing processing, comprising the steps of transferring a substrate into a substrate table, forming an electric field serving to control the distribution of the protons present in the portions of the resist corresponding to the light-exposed regions formed on the substrate, and heating the substrate after the distribution of the protons is controlled by said electric field.

Further, according to a thirteenth aspect of the present invention, there is provided a substrate processing method for processing a substrate coated with a chemical amplification type resist and subjected to a light exposure treatment before the developing processing, comprising the steps of transferring a substrate into a substrate table, and forming an electric field for moving the protons present in the portions of the resist corresponding to the light-exposed regions formed on the substrate within the portions.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detail description of the preferred embodiments given below, serve to explain the principles of the invention.

FIGS. 1A to 1C schematically show collectively the flow of the conventional photolithography process;

FIG. 14 is a cross sectional view showing the construction of the substrate processing apparatus according to a seventh embodiment of the present invention;

DETAILED DESCRIPTION OF THE INVENTION

The present invention will now be described in detail.

Figure 2A:
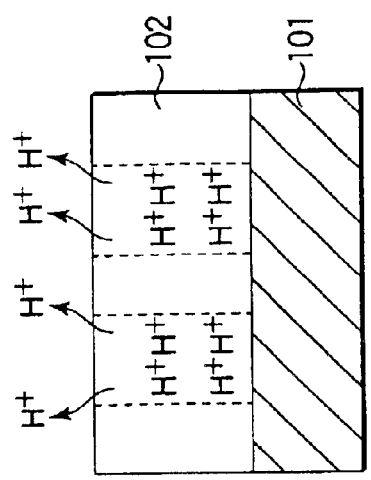
FIGS. 2A to 2C schematically exemplify the problems inherent in the conventional technology.
Figure 2B:
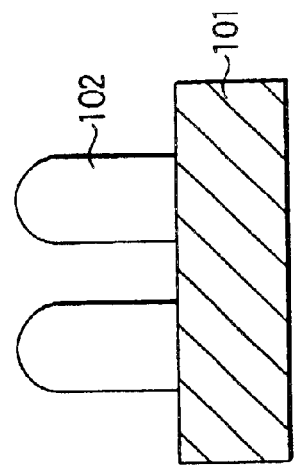
Figure 2C:
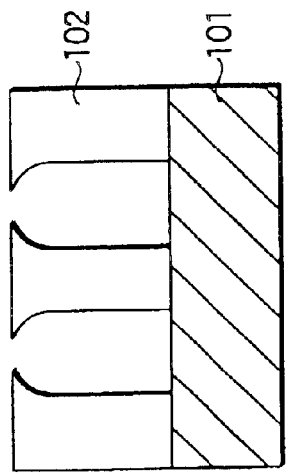
Figure 3:
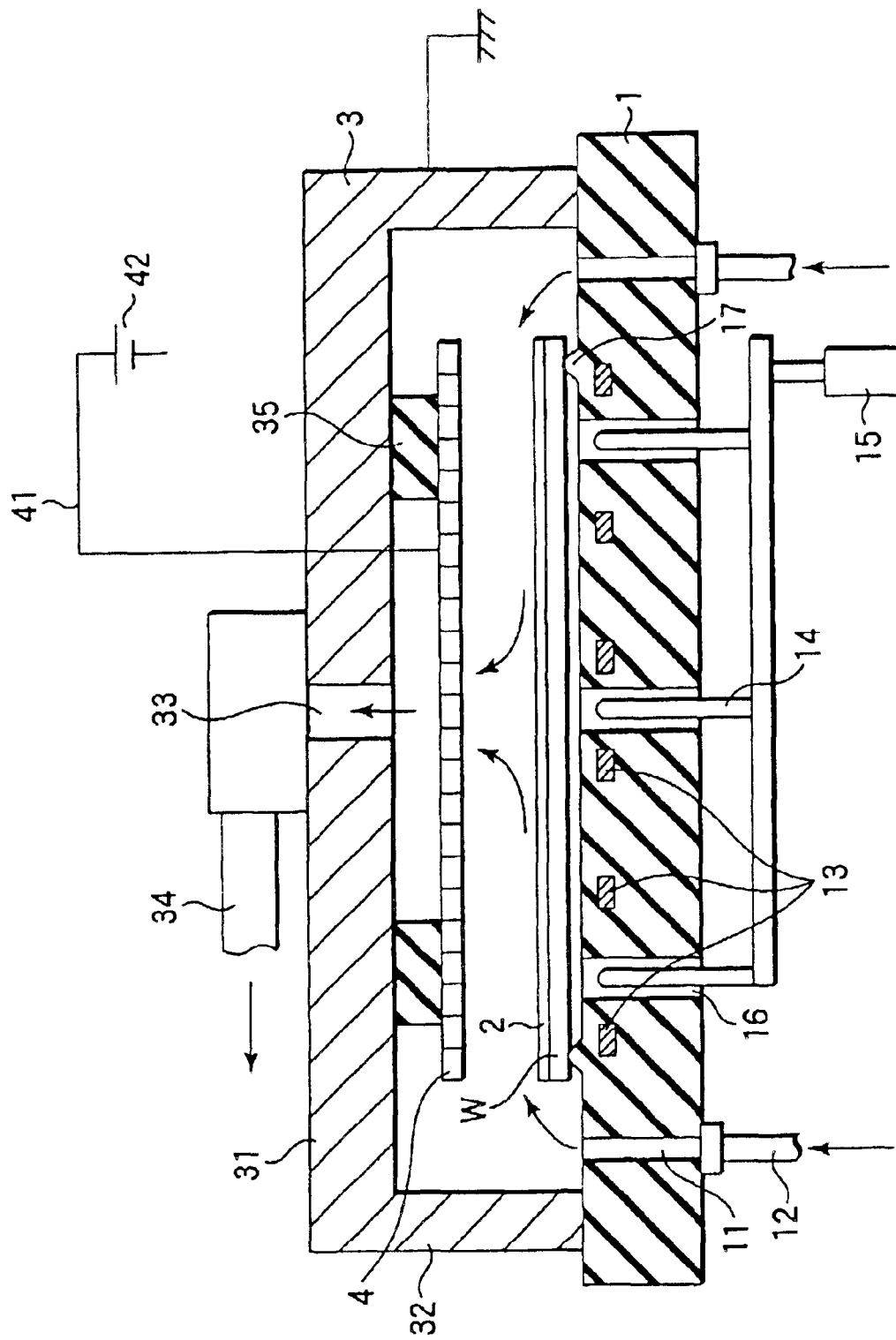
FIG. 3 is a cross sectional view showing the construction of a substrate processing apparatus according to a first embodiment of the present invention.

FIG. 3 is a cross sectional view showing the construction of the substrate processing apparatus according to the first embodiment of the present invention. The substrate processing apparatus shown in the drawing is for applying a heat treatment to the substrate coated with a chemical amplification type resist and subjected to a light exposure treatment.

The substrate processing apparatus comprises a substrate table 1 on which is disposed a substrate coated with a chemical amplification type resist 2 and subjected to a light exposure treatment, e.g., a semiconductor wafer W. The substrate table 1 is made of, for example, a ceramic material. A heater 13, e.g., a resistance heat generator, for heating the wafer W disposed on the substrate table 1 from the back side of the wafer W is concentrically buried in the substrate table 1. Projections 17 are formed in that portion of the substrate table 1 which corresponds to the outer circumferential portion of the wafer W so as to permit a small clearance, e.g., a clearance of about 0.1 mm, to be formed between the wafer W and the upper surface of the substrate table 1 when the wafer W is disposed on the substrate table 1. Under this state, the wafer W is heated to about 100° C. to 150° C. A plurality of purge gas supply ports 11 are arranged in the circumferential direction in the outer portion of the wafer disposing region in the substrate table 1. A purge supply pipe 12 for supplying the purge gas is connected to the purge gas supply port 11.

A plurality of support pins 14, i.e., three support pins 14 in the drawing, are arranged movable within hole portions 16 vertically extending through the substrate table 1. These support pins 14 can be moved in the vertical direction by a support pin lift mechanism 15 so as to perform the delivery of the wafer W between a transfer arm (not shown) and the substrate table 1.

A cylindrical lid 3 opening into the lower side, consisting of a ceiling section 31 and a side wall section 32, and made of, for example, aluminum is positioned on the upper side of the substrate table 1. The lid 3 can be moved in the vertical direction by a lid lift mechanism (not shown) and is connected to the ground. During the heating of the wafer W, the lid 3 is moved downward so as to surround the periphery of the wafer W disposed on the substrate table 1 and, thus, to define a processing space. An exhaust port 33 is formed in the central portion of the ceiling section 31 of the lid 3, and an exhaust pipe 34 for discharging the purge gas is connected to the exhaust port 33.

An electrode 4 is mounted to the inner surface of the ceiling section 31 of the lid 3 with an insulator 35 interposed therebetween such that the electrode 4 is positioned apart from and in a manner to face the upper surface (front surface) of the wafer W. The electrode 4 is formed of an air-permeable member (porous plate) and is, for example, in a circular mesh form having a size substantially equal to the size of the wafer W. The electrode 4 is formed of a material having a good electrical conductivity such as titanium, nickel or copper and is in the form of, for example, a mesh-like member. Alternatively, it is possible for the electrode 4 to be in the form of a punched metal or a metal sheet provided with concentric slits. The distance between the wafer W and the electrode 4 is set at, for example, 5 mm or 10 mm. The positive electrode of a DC power supply 42 of, for example, 10 kV is connected to the electrode 4 via a power supply line 41.

The function of the substrate processing apparatus in this embodiment will now be described.

In the first step, the surface of wafer W coated with the chemical amplification type resist 2 and subjected to the light exposure treatment is transferred by an arm (not shown) into a region above the substrate table 1, and arm and the support pins 14 are operated so as to permit the wafer W to be disposed on the substrate table 1. Then, the lid 3 is moved downward by the lid lift mechanism (not shown) so as to form a processing space surrounding the periphery of the wafer W disposed on the substrate table 1. Under this condition, the wafer W is heated to, for example, 150° C. by the heater 13. At the same time, a purge gas is introduced into the processing space through the purge gas supply port 11 and the purge gas supply pipe 12 and is discharged to the outside through the exhaust port 33 and the exhaust pipe 34, thereby forming a purge gas stream flowing along the surface of the wafer W from the periphery of the wafer W toward the central portion of the wafer W. Since the electrode 4 is formed of an air-permeable member (porous plate), the electrode 4 also performs the function of straightening the purge gas stream flowing toward the central portion of the wafer W.

Figure 4:
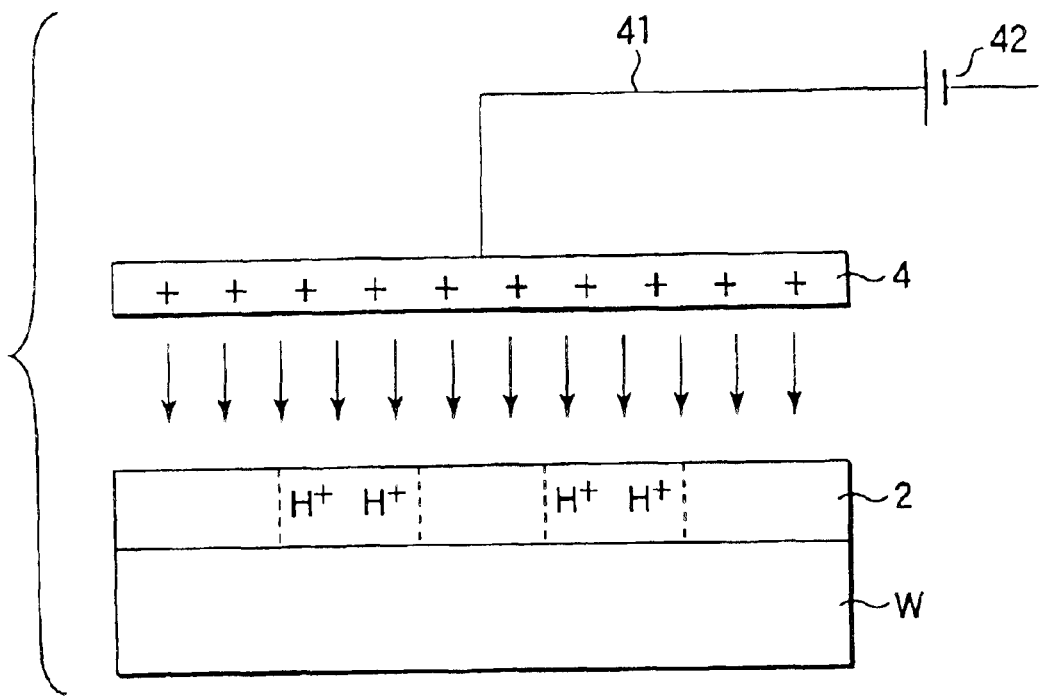
FIG. 4 schematically shows the function of the substrate processing apparatus according to the first embodiment of the present invention.

Protons ($H^+$) acting as an acid are generated from the surface of the resist 2 by the light exposure. These protons ($H^+$) are diffused into the portions of the resist 2 corresponding to the light-exposed regions by the heating so as to act as a catalyst, thereby allowing an acid catalytic reaction to proceed. Some of the protons ($H^+$) present on the surface portion of the resist 2 have a ability of scattering from the surface portion of the resist 2 to be diffused into the purge gas. However, since the electrode 4 connected to the positive side of the DC power supply 42 is arranged above the wafer W, it is possible to suppress the scattering of the protons ($H^+$) from the surface portion of the resist 2 and the diffusion of the protons ($H^+$) into the purge gas. To be more specific, since the electrode 4 is connected to the positive side of the DC power supply 42, a electric field producing the electric line of force in the direction denoted by arrows as schematically shown in FIG. 4 is formed between the electrode 4 and the wafer W, with the result that a positive charge is generated in the electrode 4. As a result, force directed toward the wafer W is exerted on the protons ($H^+$) in the surface portion of the resist 2 because of the repulsive force generated between the protons ($H^+$) and the positive charge generated in the electrode 4. It follows that it is possible to suppress the scattering of the protons ($H^+$) from the surface portion of the resist 2 and, thus, to suppress the diffusion of the protons ($H^+$) into the purge gas even if the purge gas stream is generated on the surface of the resist 2.

It should also be noted that the electrode 4 is formed of an air-permeable member (porous plate) such as a mesh-like member. As a result, a purge gas stream is formed such that the purge gas flows from the periphery of the wafer W along the surface of the wafer W toward the center of the wafer W so as to be discharged to the outside through the hole made in the electrode 4 and, then, through the exhaust port 33 and the exhaust pipe 34. It follows that it is possible to suppress the generation of the temperature distribution on the wafer W in the heating step.

As described above, according to the first embodiment of the present invention, in heating the wafer W coated with the chemical amplification type resist 2, the scattering of protons ($H^+$), which is an acid generated from the sensitizing agent by the light exposure, from the surface portion of the resist 2 is suppressed. It follows that, in the case of a negative resist, the upper portion of the formed mask pattern is substantially unlikely to be rendered roundish by the developing processing. On the other hand, in the case of a positive resist, the formed mask pattern is substantially unlikely to form a T-shaped top portion. Further, since it is possible to suppress the scattering of the protons ($H^+$) so as to prevent the scattered protons ($H^+$) from being attached to an undesired portion of the resist 2, it is possible to form a mask pattern having a high line width accuracy.

Figure 5:
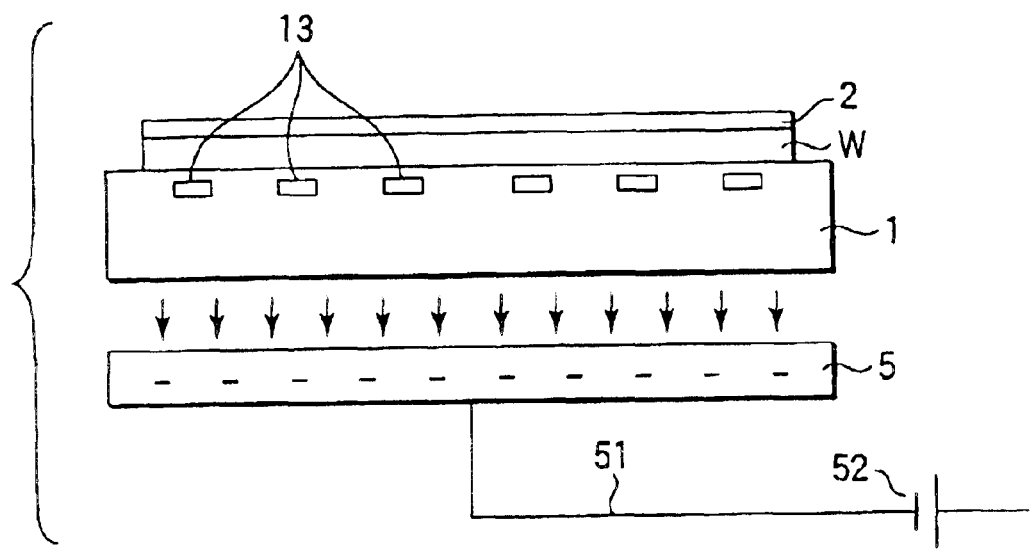
FIG. 5 schematically shows the main portion of the substrate processing apparatus according to a second embodiment of the present invention.

The second embodiment of the present invention will now be described with reference to FIGS. 5 to 7.

In the second embodiment, an electrode is mounted on the side of the back surface of the wafer W. In the example shown in FIG. 5, an electrode 5 is arranged about 5 mm apart from the lower surface of the substrate table 1, and a negative side of a DC power supply 52 is connected to the electrode 5 via a power supply line 51. In this case, since the substrate table 1 is formed of a dielectric such as a ceramic material, a electric field producing the electric line of force from the wafer W toward the electrode 5, with the result that a negative charge is generated in the electrode 5. As a result, force directed toward the wafer W is exerted on the protons (H$^+$) present in the surface portion of the resist 2 because of the attractive force generated between the protons (H$^+$) and the negative charge generated in the electrode 5. It follows that the protons (H$^+$) are not diffused into the atmosphere and, thus, it is possible to suppress the scattering of the protons (H$^+$) from the surface portion of the resist 2. Therefore it is possible to improve the line width accuracy of the developed mask pattern.

Figure 6:
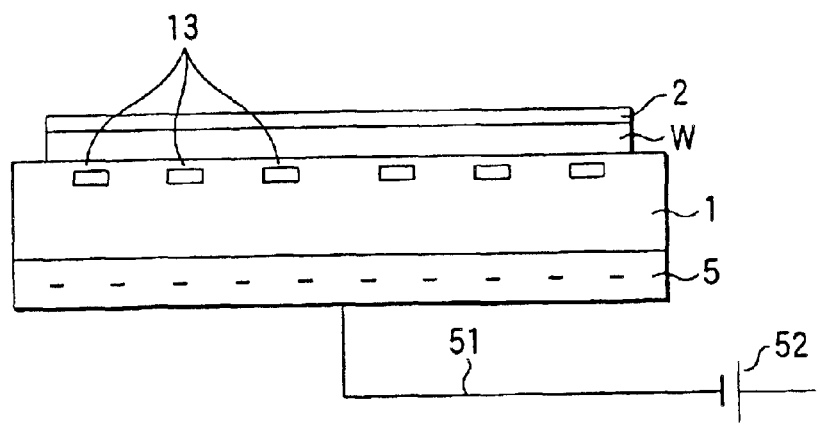
FIG. 6 schematically shows as another example the main portion of the substrate processing apparatus according to the second embodiment of the present invention.
Figure 7:
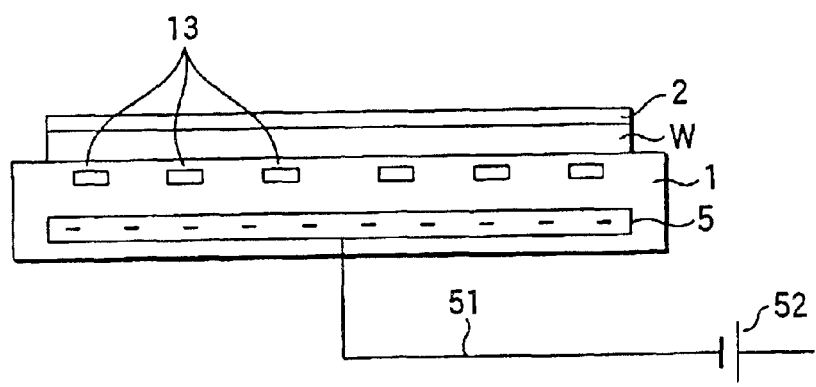
FIG. 7 schematically shows as still another example the main portion of the substrate processing apparatus according to the second embodiment of the present invention.

Incidentally, it is possible to arrange the electrode 5 in contact with the substrate table 1 as shown in FIG. 6 or to bury the electrode 5 within the substrate table 1 as shown in FIG. 7.

The third embodiment of the present invention will now be described.

Figure 8:
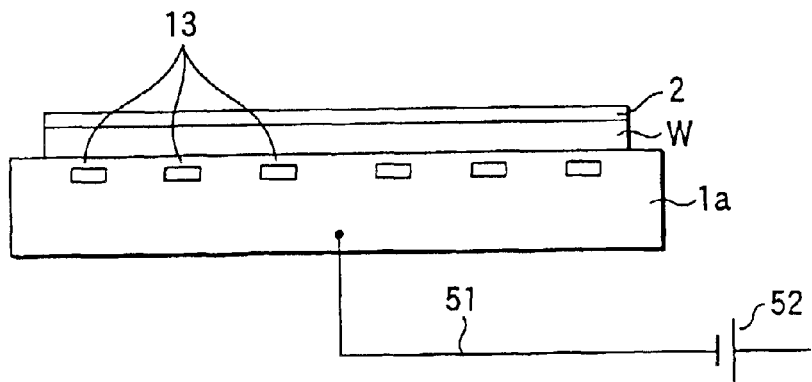
FIG. 8 schematically shows the main portion of the substrate processing apparatus according to a third embodiment of the present invention.

In the third embodiment of the present invention, a substrate table 1a made of a conductive material is arranged in place of the substrate table 1 shown in FIG. 3, and the negative side of the DC power supply 52 is connected directly to the substrate table 1a so as to allow the substrate table 1a to perform the function of the electrode, as shown in FIG. 8. In this case, the distance between the substrate table 1a acting as the electrode and the wafer W is set at, for example, 0.1 mm and voltage of scores of kV is applied between the substrate table 1a and the wafer W. Incidentally, it is necessary in this case to insulate the heater 13 and the substrate table 1a by suitable means so as to prevent the electrical interference with the heater 13.

The fourth embodiment of the present invention will now be described with reference to FIGS. 9 and 10.

In the fourth embodiment of the present invention, an electrode is arranged on each of the front surface side and the back surface side of the wafer W. FIG. 9 is directed to the combination of the construction in the first embodiment of the present invention, in which the electrode 4 is arranged on the front surface side of the wafer W, and the construction in the second embodiment of the present invention, in which the electrode 5 is arranged on the back surface side of the wafer W. In this case, a repulsive force is exerted on the protons (H$^+$) in the surface portion of the resist 2 from above and an attractive force is exerted on the protons (H$^+$) from below so as to make it possible to suppress more effectively the scattering of the acid of protons (H$^+$) from the surface portion of the resist 2.

Figure 9:
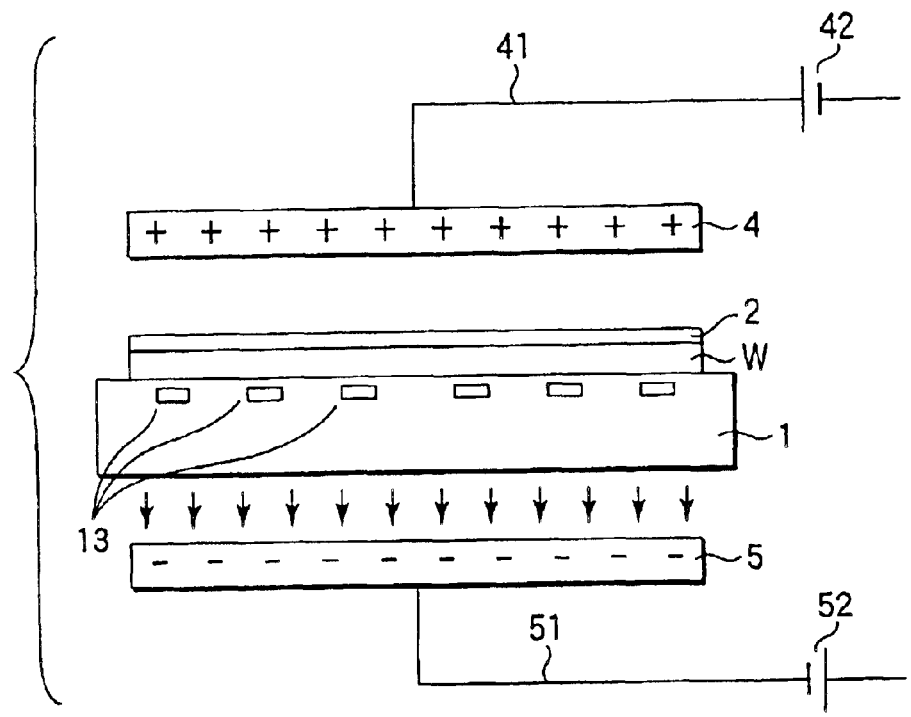
FIG. 9 schematically shows the main portion of the substrate processing apparatus according to a fourth embodiment of the present invention.
Figure 10:
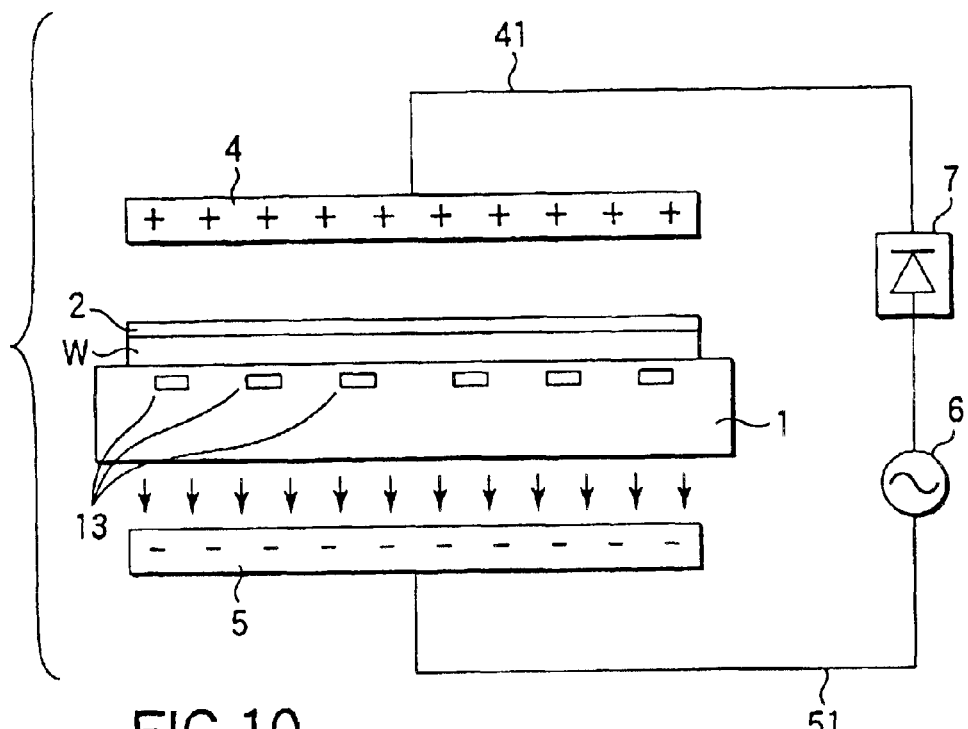
FIG. 10 schematically shows as another example the main portion of the substrate processing apparatus according to the fourth embodiment of the present invention.

In the example shown in FIG. 10, the electrodes 4 and 5 are arranged on the front surface side and the back surface side of the wafer W, respectively, like the arrangement shown in FIG. 9, and an AC power supply 6 and a full-wave rectifier 7 are connected between the electrodes 4 and 5 in place of individually connecting these electrodes 4 and 5 to the DC power supplies 42 and 52, respectively. In this construction, the electrode 4 arranged on the front surface side of the wafer W is charged positive, and the electrode 5 arranged on the back surface side of the wafer W is charged negative. As a result, the intensity of the electric field is periodically changed. However, since a repulsive force is exerted from above and an attractive force is exerted from below, it is possible to suppress the scattering of the acid of protons (H$^+$) from the surface portion of the resist 2, thereby producing the effect similar to that produced by the construction shown in FIG. 9.

Figure 11:
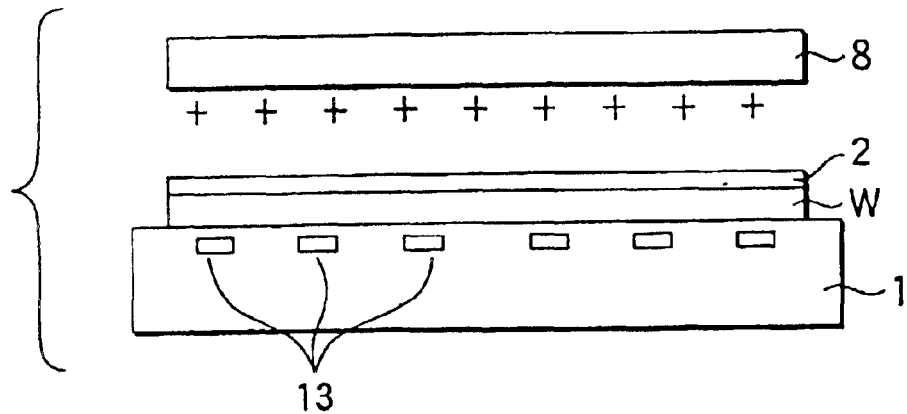
FIG. 11 schematically shows the main portion of the substrate processing apparatus according to a fifth embodiment of the present invention.

The fifth embodiment of the present invention will now be described with reference to FIG. 11.

In the fifth embodiment of the present invention, a dielectric 8 charged positive by an electrostatic induction is disposed above the wafer W disposed on the substrate table 1 in place of connecting a power supply to the electrode. In this construction, force directed toward the wafer W is exerted on the protons (H$^+$) in the surface portion of the resist 2 by the repulsive force generated between the protons (H$^+$) and the positive charge on the surface of the dielectric 8. As a result, it is possible to suppress the scattering of the protons (H$^+$) from the surface portion of the resist 2, thereby preventing the protons (H$^+$) from being diffused into the purge gas.

The sixth embodiment of the present invention will now be described with reference to FIG. 12.

Figure 13:
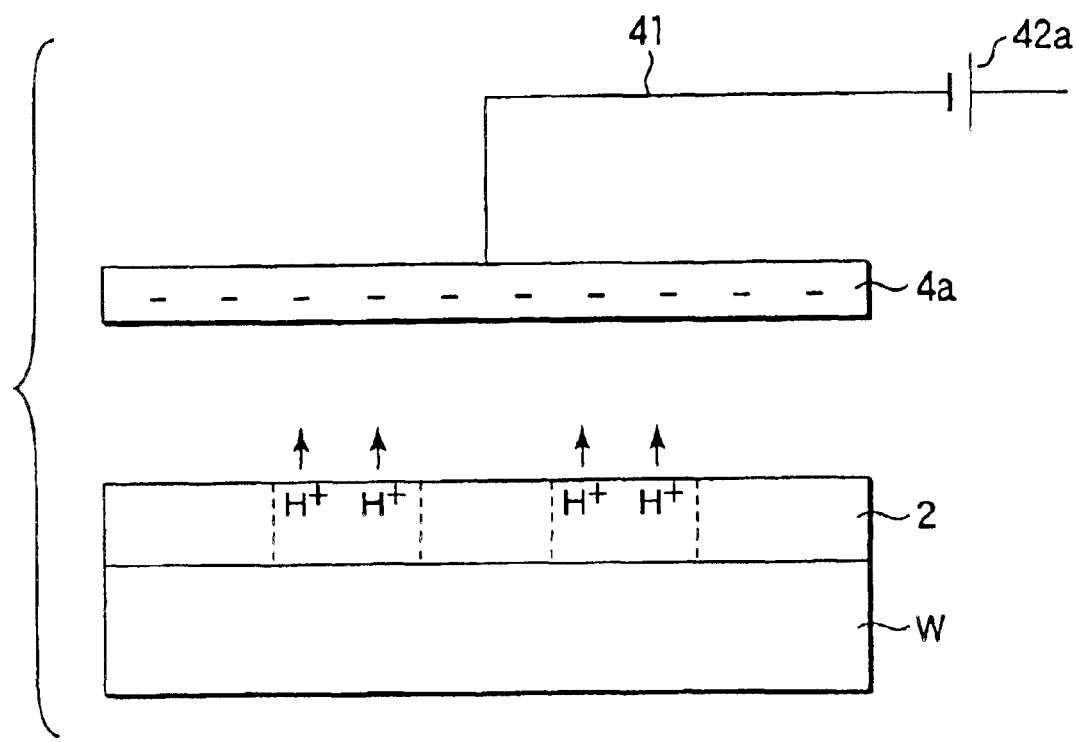
FIG. 13 schematically shows the function of the substrate processing apparatus according to the sixth embodiment of the present invention.
Figure 12:
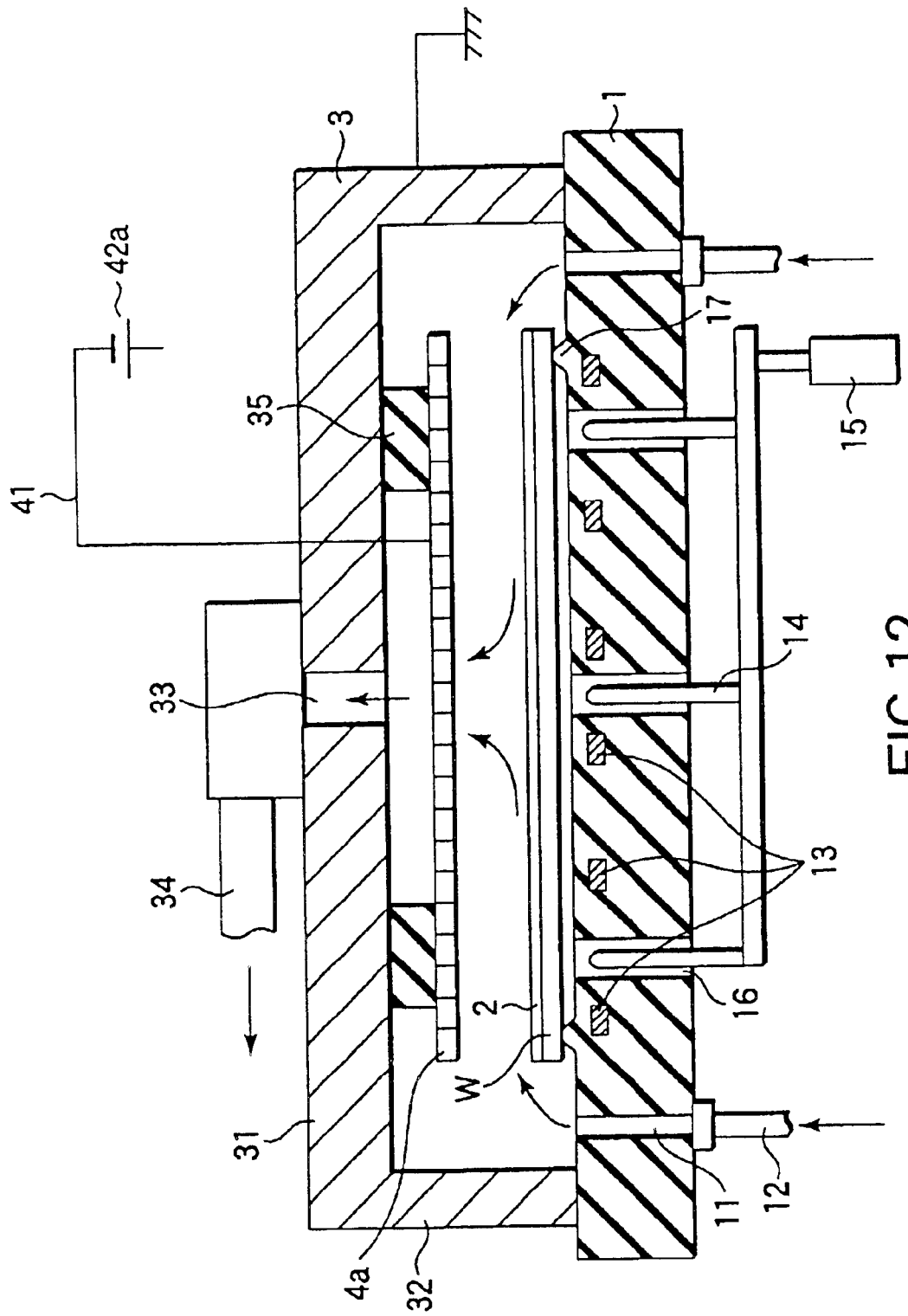
FIG. 12 is a cross sectional view showing the construction of the substrate processing apparatus according to a sixth embodiment of the present invention.

As shown in FIG. 12, the substrate processing apparatus according to the sixth embodiment of the present invention is substantially equal in the basic construction to the apparatus of the first embodiment shown in FIG. 3, except that the apparatus shown in FIG. 12 differs from the apparatus shown in FIG. 3 in that an electrode 4a connected to the negative side of a DC power supply 42a is arranged above the wafer W. In the sixth embodiment, the electrode 4a is charged negative as shown in FIG. 13, with the result that the protons (H$^+$) in the surface portion of the resist 2 are prevented from being scattered by the attractive force generated between the protons (H$^+$) and the negative charge in the electrode 4a so as to be held stationary. It follows that it is possible to prevent the protons (H$^+$) from being scattered from the surface portion of the resist 2, thereby suppressing the diffusion of the protons (H$^+$) into the purge gas. As a result, in a negative resist, the upper portion of the formed mask pattern is unlikely to be rendered roundish by the development. On the other hand, in a positive resist, the developing processing is unlikely to cause the formed mask pattern to have a T-shaped top portion. Further, since the protons (H$^+$) are prevented from being scattered so as to be attached to an undesired position of the resist 2, it is possible to obtain a good pattern accuracy.

It should be noted that, if the voltage applied to the electrode 4a is excessively high, the protons (H$^+$) on the surface portions of the resist corresponding to the light-exposed regions are attracted toward the electrode 4a so as to bring about an inconvenience. Such being the situation, it is desirable to control the voltage applied to the electrode 4a such that the protons (H$^+$) are held stationary on the surface portions of the resist corresponding to the light-exposed regions.

The seventh embodiment of the present invention will now be described with reference to FIG. 14.

In the seventh embodiment of the present invention, a lid 3a having a gas inlet port 36 formed through one side wall and a gas outlet port 37 formed through the opposite side wall are arranged movable in the vertical direction in place of the lid 3 shown in FIG. 3. The lid 3a is moved downward so as to form a processing space around the wafer W coated with the resist 2 and disposed in the substrate table 1. A purge gas stream flowing from the gas inlet port 36 toward the gas outlet port 37 is formed in the processing space. An ionizer 9 is arranged outside the side wall, through which extends the gas inlet port 36, of the lid 3a. The purge gas supplied from a purge gas supply source (not shown) is ionized positive by the ionizer 9 before the purge gas flows to reach the gas inlet port 36. The purge gas used in this embodiment includes, for example, a N$_2$ gas, an Ar gas and a He gas. Incidentally, the members of the substrate processing apparatus shown in FIG. 14, which are equal to those of the apparatus shown in FIG. 3, are denoted by the same reference numerals so as to avoid an overlapping description.

In operating the substrate processing apparatus shown in FIG. 14, the wafer W having the surface coated with a chemical amplification type resist and subjected to the light exposure treatment is disposed on the substrate table 1. Then, the lid 3a is moved downward by a lid lift mechanism (not shown) so as to form a processing space surrounding the wafer W disposed on the substrate table 1. Under this condition, the wafer W is heated by the heater 13 to, for example, 150° C. and, at the same time, a purge gas supplied from the purge supply source (not shown) is introduced into the processing space through the gas inlet port 36 and discharged to the outside through the gas outlet port 37, thereby forming a purge gas stream within the processing space such that the purge gas stream flows in parallel with and along the wafer W from the gas inlet port 36 toward the gas outlet port 37.

It should be noted that the purge gas stream flowing toward the gas inlet port 36 is ionized positive by the ionizer 9. It follows that the purge gas charged positive flows along the surface of the resist 2 formed on the wafer W positioned within the processing space.

As a result, force directed toward the wafer W is exerted on the protons ($H^+$) present in the surface portion of the resist 2 by effect of the repulsive force produced between the positive charge of the positively charged purge gas stream and the protons ($H^+$) so as to prevent the protons ($H^+$) from being scattered from the surface portion of the resist 2, thereby suppressing the diffusion of the protons ($H^+$) into the purge gas.

As described above, the protons ($H^+$) are prevented from being scattered and diffused into the purge gas. Therefore, in a negative resist, the upper portion of the formed mask pattern is less likely to be rendered roundish by the developing processing. On the other hand, in a positive resist, the formed mask pattern is less likely to be caused to have a T-shaped top portion by the developing processing. Further, since it is possible to prevent the protons ($H^+$) from being scattered so as to be attached again to an undesired portion of the resist 2, it is possible to form a mask pattern having a high line width accuracy.

Figure 15:
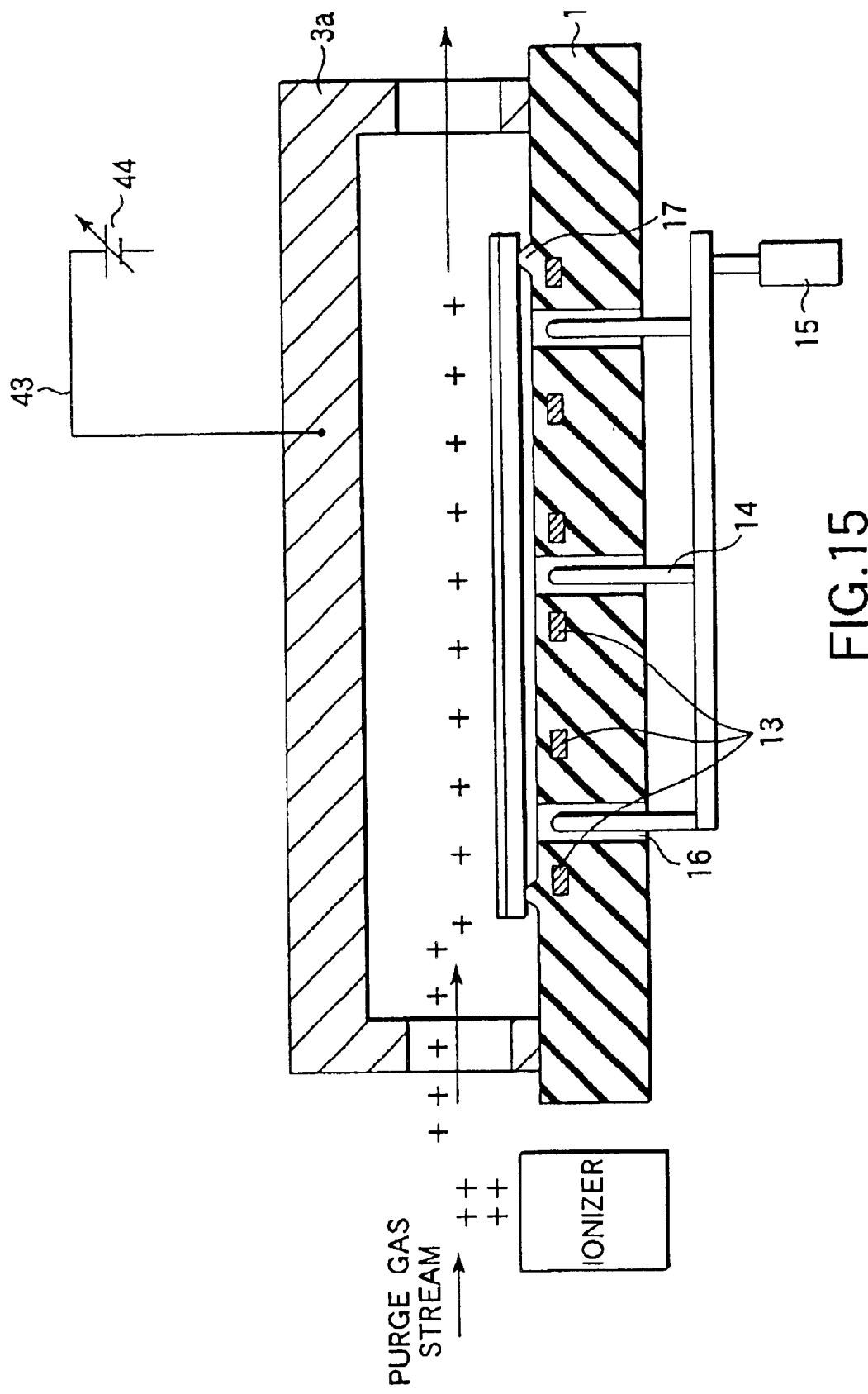
FIG. 15 is a cross sectional view showing another example of the construction of the substrate processing apparatus according to the seventh embodiment of the present invention.

Alternatively, it is possible to connect a DC power supply whose voltage is variable to the lid 3a through a power supply line 43 so as to apply a positive voltage to the lid 3a, as shown in FIG. 15. In this case, the lid 3a performs the function of an electrode. As a result, the purge gas stream flows under the state that the positive ions present in the purge gas stream are kept receiving force directed toward the wafer W by the positive charge generated in the lid 3a acting as an electrode so as to make it possible to suppress more effectively the scattering of the protons ($H^+$). It should also be noted that the flow of the ionized gas stream can be controlled optionally by controlling the voltage of the DC power supply 44. Incidentally, it is also possible to mount an electrode separately above the wafer W so as to apply a positive voltage to the electrode in place of applying a positive voltage to the lid 3a. Further, the formed purge gas stream does not necessarily flow in one direction.

The eighth embodiment of the present invention will now be described with reference to FIG. 16.

The eighth embodiment is directed to a substrate processing apparatus capable of making uniform the initial distribution of protons ($H^+$) in the portions of the resist corresponding to the light-exposed regions in the post-exposure bake of a chemical amplification type resist.

Figure 16:
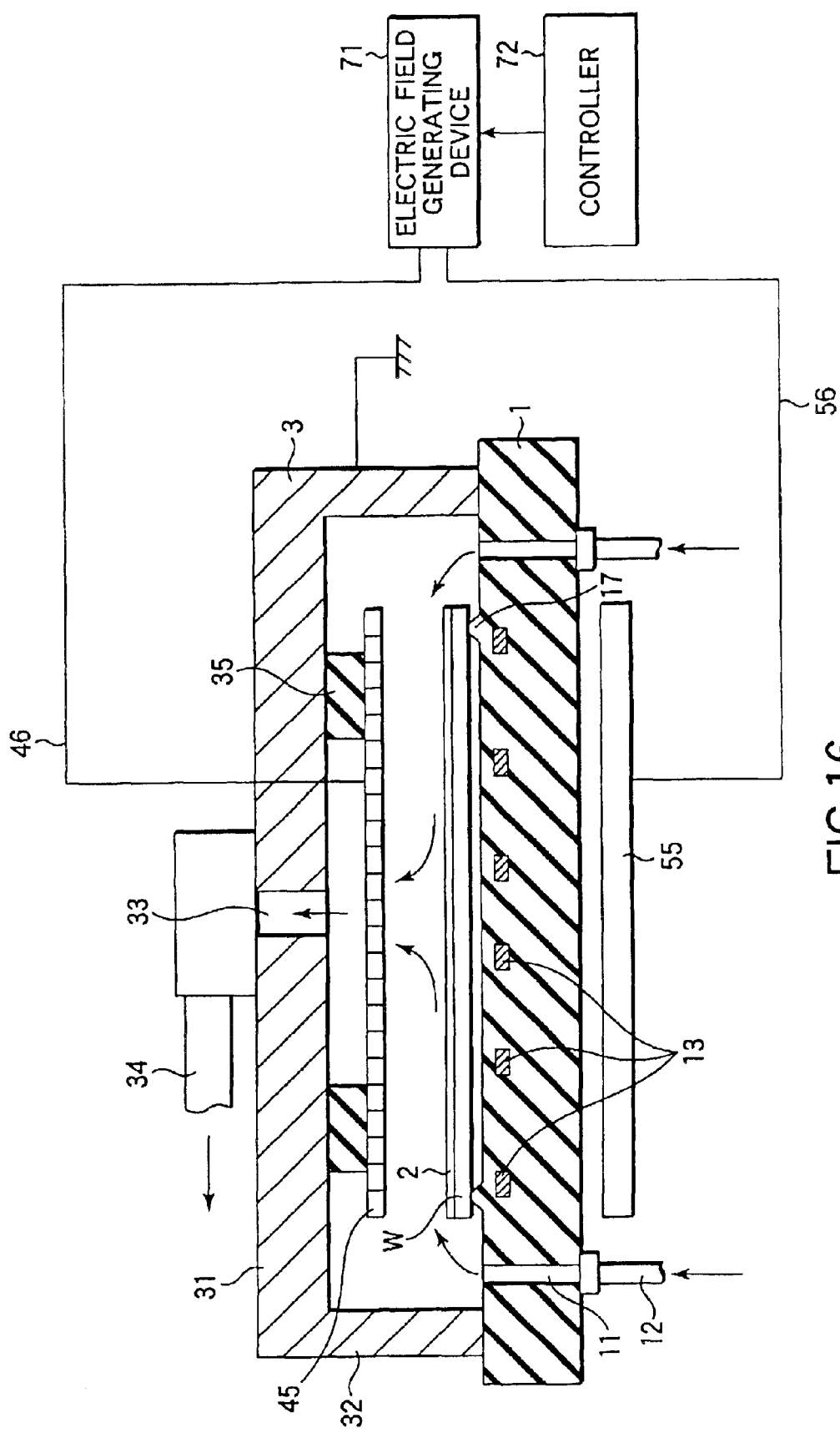
FIG. 16 is a cross sectional view showing the construction of the substrate processing apparatus according to an eighth embodiment of the present invention.

The substrate processing apparatus shown in FIG. 16 comprises the substrate table 1 and the lid 3 equal in construction to the substrate table 1 and the lid 3 included in the apparatus shown in FIG. 3. As in the apparatus shown in FIG. 3, the lid 3 is moved downward so as to form a processing space, and a purge gas stream flowing from the peripheral portion toward the center is formed in the processing space. Incidentally, the support pins, the support pin lift mechanism, etc., which are arranged vertically movable relative to the substrate table 1, are omitted in the drawing of FIG. 16.

In the apparatus shown in FIG. 16, an upper electrode 45 is mounted to the inner surface of the lid 3 with an insulator 35 interposed therebetween. The upper electrode 45 is positioned above the front surface of the wafer W disposed on the substrate table 1 in a manner to face the wafer W. Like the electrode 4 shown in FIG. 3, the upper electrode 45 is formed of an air-permeable member (porous plate). On the other hand, a lower electrode 55 is arranged below the back surface of the wafer W disposed on the substrate table 1. To be more specific, the lower electrode 55 is positioned below the substrate table 1.

These upper electrode 45 and lower electrode 55 are connected to an electric field generating device 71 via power supply lines 46 and 56, respectively. The electric field generating device 71 is controlled by a controller 72. Voltages of the opposite polarities are applied to the upper electrode 45 and the lower electrode 55, and the polarities of the applied voltages are reversed a plurality of times so as to control the distribution of the protons ($H^+$) in the portions of the resist 2 corresponding to the light-exposed regions. Incidentally, the members of the apparatus shown in FIG. 16, which are equal to the members of the apparatus shown in FIG. 3, are denoted by the same reference numerals so as to avoid an overlapping description.

Figure 17A:
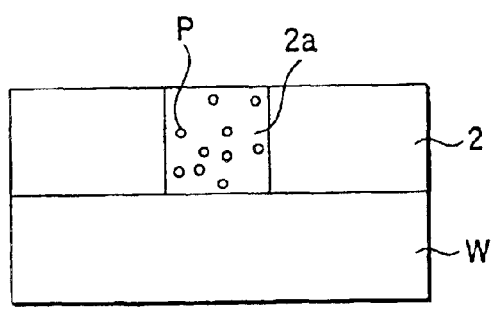
FIG. 17A schematically shows the initial distribution of the protons ($H^+$) in the portion of the chemical amplification type resist corresponding to the light-exposed region after the light exposure treatment.
Figure 17B:
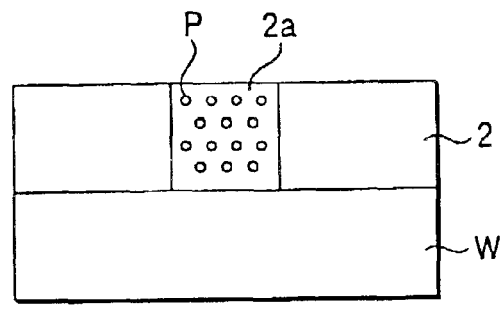
FIG. 17B schematically shows the portion of the resist corresponding to the light-exposed region in which the protons ($H^+$) are distributed uniformly by the function of an electric field in the apparatus shown in FIG. 16.
Figure 18:
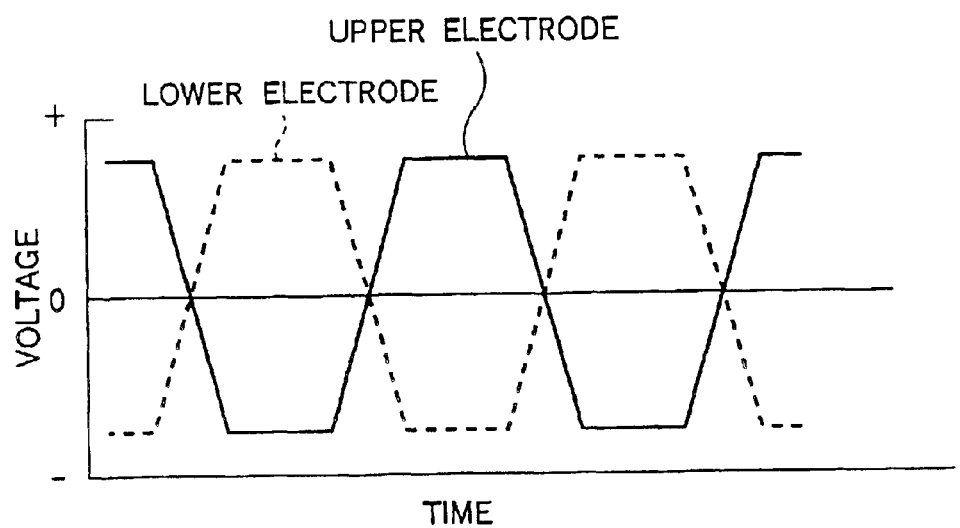
FIG. 18 is a graph showing the curves of the voltage applied to the upper electrode and to the lower electrode included in the substrate processing apparatus shown in FIG. 16.

In operating the substrate processing apparatus of the construction described above, the wafer W having the surface coated with a chemical amplification type resist and subjected to a light exposure treatment is disposed on the substrate table 1. Then, the lid 3 is moved downward by a lid lift mechanism (not shown) so as to form a processing space surrounding the periphery of the wafer W disposed on the substrate table 1. In this case, the initial distribution of the protons ($H^+$) P is poor in the portions of the resist 2 corresponding to the light-exposed regions as shown in FIG. 17A. In order to overcome the poor distribution of the protons, prescribed voltages of the opposite polarities are applied to the upper electrode 45 and the lower electrode 55 prior to the heat treatment, and the polarities of the applied voltages are reversed a plurality of times, as shown in FIG. 18. As a result, the protons ($H^+$) are moved within the portion 2a of the resist 2 corresponding to the light-exposed region so as to permit the protons ($H^+$) to be distributed uniformly within the portion 2a of the resist 2, thereby achieving a uniform distribution of the protons ($H^+$). In this case, it suffices to keep the electric field applied for several seconds to scores of seconds in total. Also, it suffices to reverse the polarity of the applied voltage not more than 10 times. Depending on the situation, the distribution of the protons ($H^+$) can be made sufficiently uniform by reversing the polarity of the applied voltage only once.

If the distribution of the protons ($H^+$) in the portion of the resist corresponding to the light-exposed region is made uniform as described above, a chain reaction takes place uniformly in the portion of the resist corresponding to the light-exposed region in the subsequent heat treatment so as to make it possible to increase the uniformity of the line width. It is also possible to lower the required heating temperature so as to avoid the inconvenience that takes place if the heating temperature is elevated. It should also be noted that, since the initial distribution of the protons (H$^+$) is uniform so as to eliminate a portion where the protons (H$^+$) are deficient, it is unnecessary to set the light exposure amount at an excessively high level for avoiding the deficiency of the protons (H$^+$) as in the prior art. It follows that it is possible to eliminate the waste of the energy in the light exposure step. Further, transpiration of protons (H$^+$) is unlikely to take place.

It is also possible to inhibit the transpiration of the protons (H$^+$) in applying the heat treatment by applying a positive voltage to the upper electrode 45 and a negative voltage to the lower electrode 55 so as to set up the state shown in FIG. 9. Of course, it is possible to stop the voltage application in applying the heat treatment.

Figure 19:
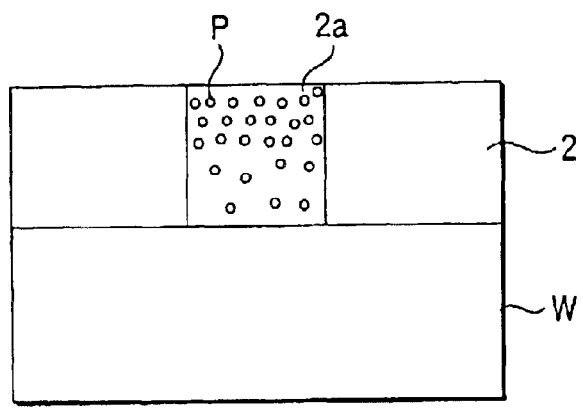
FIG. 19 schematically exemplifies the distribution of the protons ($H^+$) in the portion of the resist corresponding to the light-exposed region formed by the substrate apparatus shown in FIG. 16.

Further, the voltage application can be employed not only for making uniform the initial distribution of the protons (H$^+$) in the portions of the resist corresponding to the light-exposed regions but also for positively forming a desired distribution of the protons (H$^+$). For example, in a negative resist, the degree of insolubility in the surface portion is increased if the concentration of the protons (H$^+$) P is high in the surface portion of the resist corresponding to the light-exposed region as shown in FIG. 19 so as to make it possible to further improve the line width accuracy.

It should be noted that the post-exposure bake treatment is a treatment for promoting the chain reaction of generating protons (H$^+$). If the protons (H$^+$) are moved within the portions of the resist corresponding to the light-exposed regions by application of an electric field as in this embodiment, the chain reaction is promoted by the movement of the protons (H$^+$). It follows that it is not absolutely necessary to heat the wafer W by using a heater.

Figure 20:
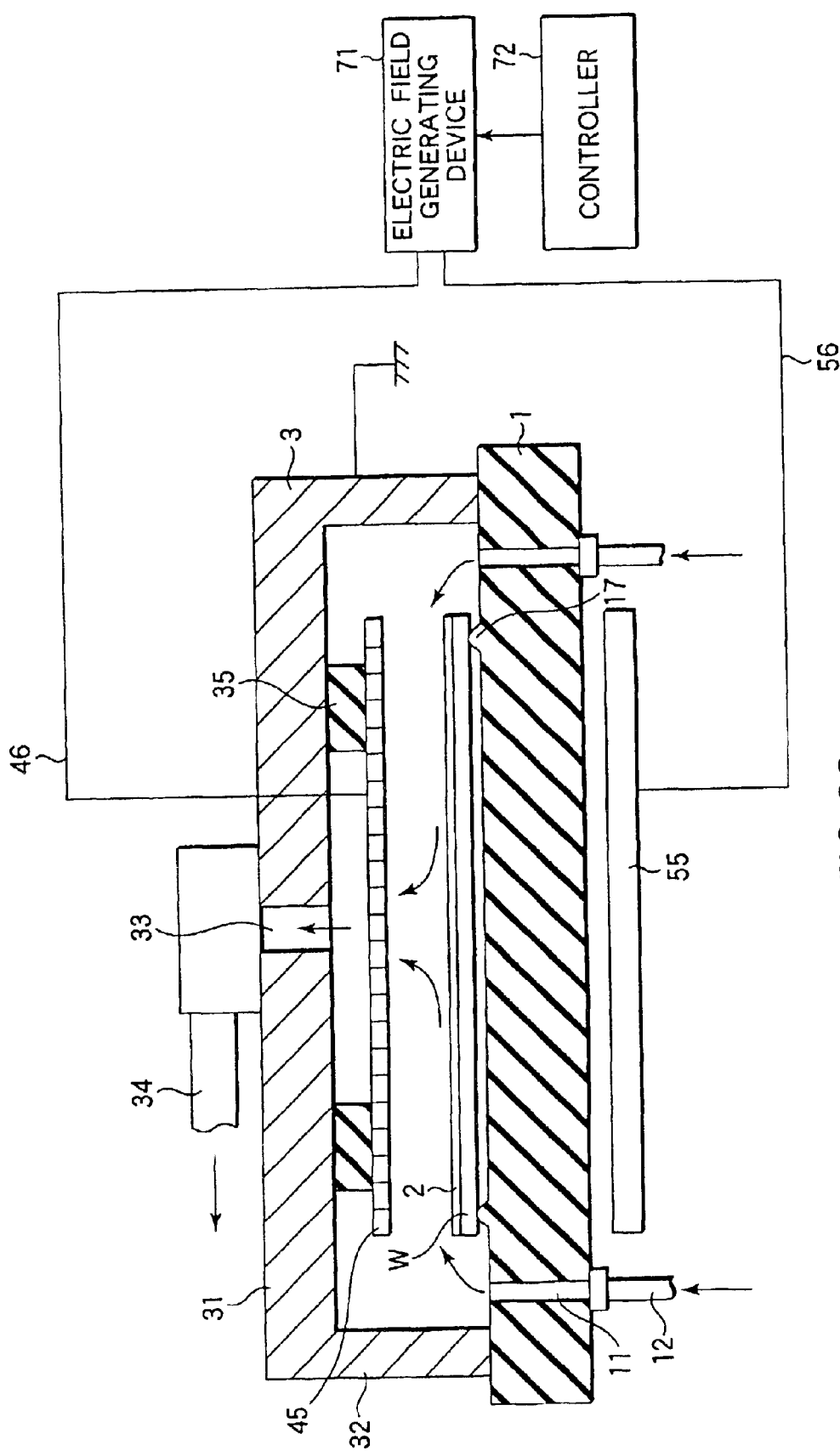
FIG. 20 is a cross sectional view showing the construction of the substrate processing apparatus according to a ninth embodiment of the present invention.

The ninth embodiment of the present invention is directed to a substrate processing apparatus utilizing the particular principle described above. Specifically, FIG. 20 is a cross sectional view showing the construction of the substrate processing apparatus according to the ninth embodiment of the present invention. The apparatus shown in FIG. 20 is equal in its basic construction to the apparatus shown in FIG. 16 and differs from the apparatus shown in FIG. 16 in that a heater is not included in the apparatus shown in FIG. 20. In the apparatus shown in FIG. 20, voltages of the opposite polarities are applied from the electric field generating device 71 to the upper electrode 45 and the lower electrode 55, and the electric field generating device 71 is controlled by the controller 72 so as to reverse the polarities of the voltages applied to the upper electrode 45 and the lower electrode 55 a plurality of times, thereby carrying out a treatment corresponding to the post-exposure bake treatment by utilizing the function of the electric field alone.

Incidentally, in the ninth embodiment of the present invention, it is possible to mount any one of the upper electrode 45 and the lower electrode 55. In this case, it is possible to move the protons (H$^+$) within the portions of the resist corresponding to the light-exposed regions by simply turning on and off the voltage applied to the electrode so as to make uniform the protons (H$^+$) or to form the distribution of the protons (H$^+$).

Figure 21:
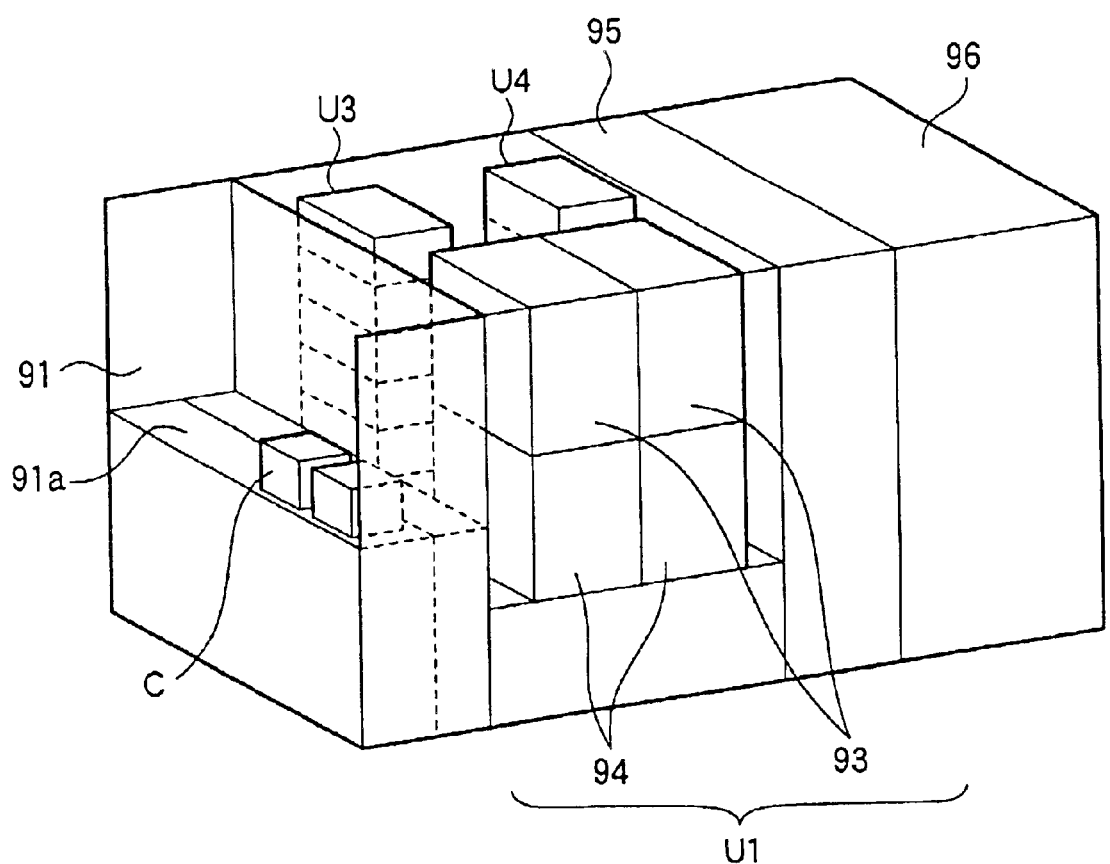
FIG. 21 is an oblique view exemplifying the construction of a resist coating-developing apparatus having the substrate processing apparatus of the present invention incorporated therein.
Figure 22:
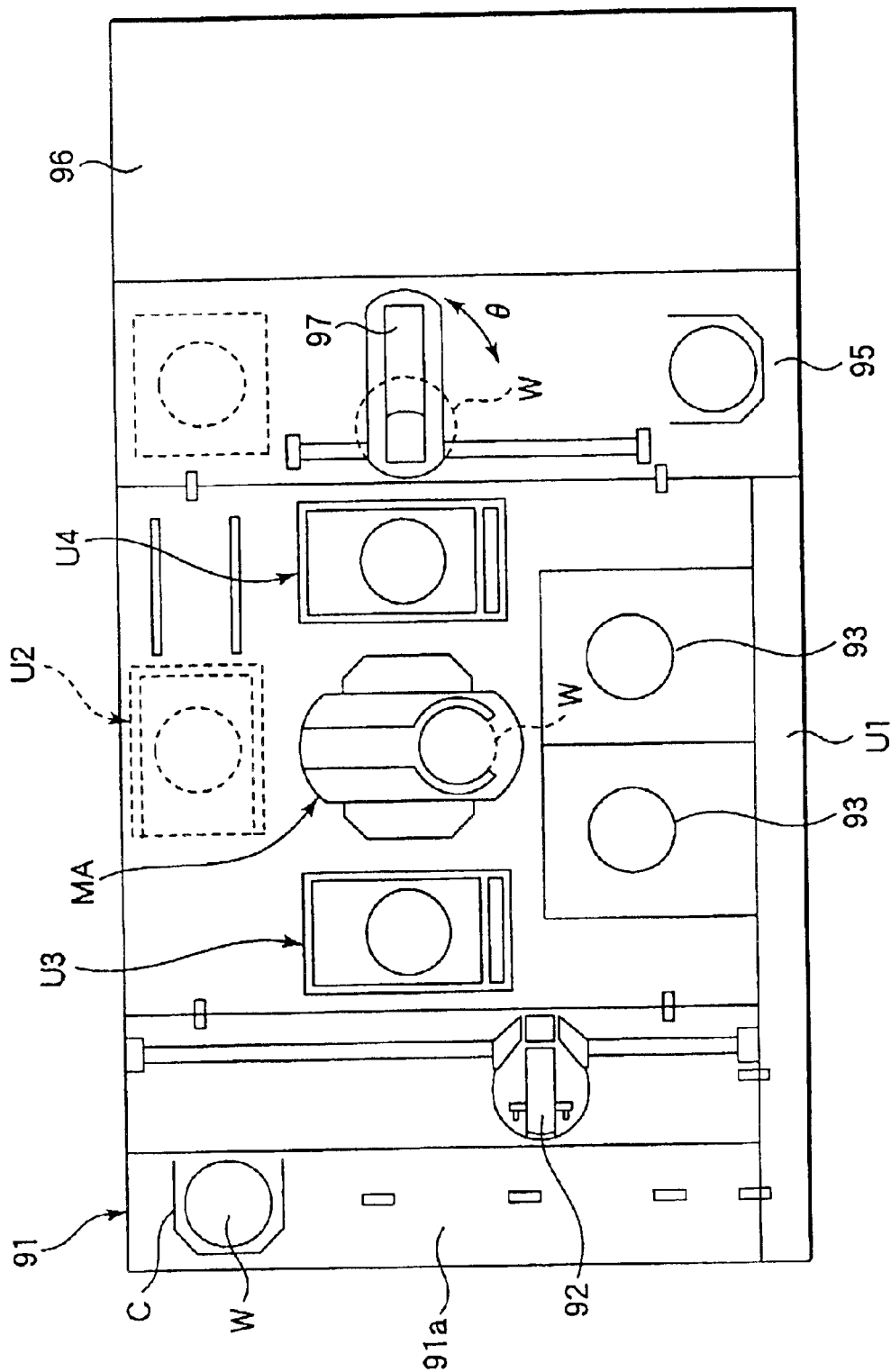
FIG. 22 is a plan view exemplifying the construction of a resist coating-developing apparatus having the substrate processing apparatus of the present invention incorporated therein.

An example of a resist coating-developing apparatus in which is incorporated a substrate processing apparatus according to any one of the embodiments of the present invention described above, said substrate processing apparatus performing the post-exposure bake treatment described above or a treatment corresponding thereto, will now be described with reference to FIGS. 21 and 22. As shown in FIGS. 21 and 22, the resist coating-developing apparatus comprises a cassette station 91 for transporting a cassette C having, for example, 25 wafers housed therein. A table 91a on which is disposed the cassette C and a transport mechanism 92 for taking the wafer W out of the cassette C are arranged in the cassette station 91. A resist coating-developing system unit block U1 in which the units of the resist coating-developing system are collectively disposed is arranged behind the cassette station 91 on the right side, looking from the cassette station 91. Also, a stacked unit block U2 in which the units of the heating-cooling system are stacked one upon the other to form a multi-stage structure is arranged behind the cassette station 91 on the left side, looking from the cassette station 91. Further, a stacked unit block U3 in which the units of the heating-cooling system are stacked one upon the other to form a multi-stage structure is arranged behind and close to the cassette station 91. Still further, a stacked unit block U4 in which the units of the heating-cooling system are stacked one upon the other to form a multi-stage structure is arranged behind the cassette station 91. The stacked unit block U4 is positioned remoter from the cassette station 91 than the stacked unit block U3. The substrate processing apparatus according to any one of the embodiments of the present invention described above constitutes a single or a plurality of units included in the stacked unit blocks U2, U3 and U4. Also, a transfer arm MA for transporting the wafer W among the units constituting the unit blocks U1, U2, U3 and U4 is arranged in a manner to be surrounded by the resist coating-developing system unit block U1 and the stacked unit blocks U2, U3 and U4. Incidentally, the transport mechanism 92, the unit block U2 and the transfer arm MA are not depicted in FIG. 21 for simplifying the drawing.

In the resist coating-developing system unit block U1, two coating units 94 each equipped with a coating device are arranged side by side in the lower stage, and two developing units 93 are arranged on the two coating units 94 so as to form an upper stage. In each of the stacked unit blocks U2, U3, U4, a wafer transport unit, a unit for the hydrophobic treatment, etc., are arranged together with the heating units and the cooling units so as to form a stacked structure.

The process station in which are arranged the transfer arm MA, the resist coating-developing system unit U1, etc. is connected to a light exposure device 96 with an interface unit 95 interposed therebetween. A wafer transport mechanism 97 is arranged in the interface unit 95 so as to perform transport of the wafer W between the process station and the light exposure device 96.

The flow of the processing of the wafer W carried out in the resist coating-developing apparatus shown in FIGS. 21 and 22 will now be described. In the first step, the wafer cassette C housing the wafers W is introduced from the outside so as to be disposed on the table 91a. Then, the wafer W is taken out of the wafer cassette C by the transport mechanism 92 and transported to the transfer arm MA through a transport table, which is one of the units constituting the heating-cooling unit block U3. Further, a hydrophobic treatment is applied to the wafer W within a single stage of the process section included in the unit block U3 and, then, the wafer W is coated with a resist solution within the coating unit 94 so as to form a resist film. The wafer W coated with the resist film is heated in the heating unit and, then, transferred into the cooling unit included in the unit block U4. It should be noted that the wafer W can be transported between the cooling unit noted above and the transport mechanism 97 included in the interface unit 95. The wafer W after treatment in the cooling unit is further transferred into the light exposure device 96 through the interface unit 95 and the transport mechanism 97 and the wafer W is exposed to light by using a mask having a prescribed pattern. The light-exposed wafer W is received by the transport mechanism 97 so as to be transported to the wafer transfer arm MA of the process station through the transport unit of the unit block U4.

Further, the wafer W is heated to a prescribed temperature in the process unit included in any of the stacked unit blocks U2, U3, U4, said process unit being the substrate processing apparatus according to any one of the embodiments of the present invention described above. After the heating, the wafer W is cooled to a prescribed temperature in the cooling unit and, then, transferred into the developing unit 93 for application of a developing processing to the wafer W so as to form a resist mask. Finally, the wafer W is brought back into the cassette C disposed on the table 91*a*.

In each of the embodiments described above, a semiconductor wafer is used as the substrate to be processed. However, the apparatus and method of the present invention can also be applied to substrates other than the semiconductor wafer. For example, it is possible to apply the apparatus and the method of the present invention to the treatment of an LCD substrate and a reticle substrate for a photomask.

It should be noted that the embodiments described above are simply intended to clarify the technical idea of the present invention. Naturally, the technical scope of the present invention should not be construed solely on the basis of the specific embodiments described above. In other words, the present invention can be worked in variously modified fashions on the basis of the spirit of the present invention and within the scope defined in the accompanying claims.

What is claimed is:

1. A substrate processing apparatus for processing a substrate coated with a chemical amplification type resist and subjected to a light exposure treatment before the developing processing, comprising:

the substrate table on which a substrate is disposed;

a heater for heating the substrate disposed on said substrate table; and an electric field forming mechanism for forming an electric field in a manner to prevent the protons generated in the resist formed on the substrate disposed on the substrate table from being scattered.

2. A substrate processing apparatus for processing a substrate coated with a chemical amplification type resist and subjected to a light exposure treatment before the developing processing, comprising:

the substrate table on which a substrate is disposed;

a heater for heating the substrate disposed on said substrate table; and an electric field forming mechanism for forming an electric field in a manner to exert force, which is directed toward the substrate, on the protons generated in the resist formed on the substrate disposed on said substrate table.

3. The substrate processing apparatus according to claim 2, wherein said electric field forming mechanism includes an electrode arranged to face the front surface of the substrate disposed on said substrate table and a DC power supply section whose positive side is connected to said electrode.

4. The substrate processing apparatus according to claim 2, wherein said electric field forming mechanism includes an electrode arranged on the back side of the substrate disposed on said substrate table in a manner to face the substrate and a DC power supply section whose negative side is connected to said electrode.

5. The substrate processing apparatus according to claim 4, wherein the electrode arranged on the back side of said substrate is arranged in contact with said substrate table.

6. The substrate processing apparatus according to claim 4, wherein the electrode arranged on the back side of said substrate is arranged within said substrate table.

7. The substrate processing apparatus according to claim 2, wherein said electric field forming mechanism includes a DC power supply section whose negative side is connected to said substrate table.

8. The substrate processing apparatus according to claim 2, wherein said electric field forming mechanism includes a first electrode arranged to face the front side of the substrate disposed on said substrate table, a first DC power supply section whose positive side is connected to said first electrode, a second electrode arranged on the back side of the substrate disposed on said substrate table in a manner to face the substrate, and a second DC power supply section whose negative side is connected to said second electrode.

9. The substrate processing apparatus according to claim 2, wherein said electric field forming mechanism includes a first electrode arranged to face the front side of the substrate disposed on said substrate table, a second electrode arranged on the back side of the substrate disposed on said substrate table in a manner to face the substrate, an AC power supply section connected between the first and second electrodes, and a rectifier connected to said AC power supply section such that said first electrode forms a negative electrode.

10. A substrate processing apparatus for processing a substrate coated with a chemical amplification type resist and subjected to a light exposure treatment before the developing processing, comprising:

the substrate table on which a substrate is disposed;

a heater for heating the substrate disposed on said substrate table; and a charge holding member for holding the charge exerting force, which is directed toward the substrate, on the protons generated in the resist formed on the substrate disposed on said substrate table.

11. The substrate processing apparatus according to claim 10, wherein said charge holding member is arranged to face the front side of the substrate disposed on said substrate table.

12. A substrate processing apparatus for processing a substrate coated with a chemical amplification type resist and subjected to a light exposure treatment before the developing processing, comprising:

the substrate table on which a substrate is disposed;

a heater for heating the substrate disposed on said substrate table; and an electric field forming mechanism for forming an electric field in a manner to exert force, which is directed upward, on the protons generated in the resist formed on the substrate disposed on said substrate table.

13. The substrate processing apparatus according to claim 12, wherein said electric field forming mechanism includes an electrode arranged to face the front side of the substrate disposed on said substrate table and a DC power supply section whose negative side is connected to said electrode.

14. The substrate processing apparatus according to claim 13, further comprising means for forming a purge gas stream along the surface of the substrate, the electrode arranged on the front side of said substrate including an air-permeable member.

15. A substrate processing apparatus for processing a substrate coated with a chemical amplification type resist and subjected to a light exposure treatment before the developing processing, comprising:

the substrate table on which a substrate is disposed;

a heater for heating the substrate disposed on said substrate table;

means for forming a purge gas stream along the substrate disposed on said substrate table; and an ionizer for charging positive said purge gas stream.

16. The substrate processing apparatus according to claim 15, further comprising an electric field forming mechanism for forming an electric field exerting force, which is directed toward the substrate, on the positively charged purge gas stream.

17. The substrate processing apparatus according to claim 16, wherein said electric field forming mechanism includes an electrode arranged above said substrate table and a DC power supply section whose positive side is connected to said electrode.

18. The substrate processing apparatus according to claim 17, wherein said DC power supply section is capable of varying the voltage and said purge gas stream is controlled by varying the voltage.

19. A substrate processing apparatus for processing a substrate coated with a chemical amplification type resist and subjected to a light exposure treatment before the developing processing, comprising:

the substrate table on which a substrate is disposed;

a heater for heating the substrate disposed on said substrate table; and an electric field forming mechanism for forming an electric field capable of controlling the distribution of the protons in the portions of the resist corresponding to light-exposed regions formed on the substrate disposed on said substrate table.

20. The substrate processing apparatus according to claim 19, wherein said electric field forming mechanism includes an upper electrode arranged to face the front side of the substrate disposed on said substrate table, a lower electrode arranged on the back side of the substrate disposed on said substrate table in a manner to face the substrate, an electric field generating device for generating electric field by applying a voltage to said upper electrode and said lower electrode, and a controller for controlling said electric field generating device.

21. The substrate processing apparatus according to claim 20, wherein said controller controls said electric field generating device such that voltages of opposite polarities are applied to said upper electrode and said lower electrode, and the polarities of the voltages applied to the upper and lower electrodes are reversed a plurality of times.

22. A substrate processing apparatus for processing a substrate coated with a chemical amplification type resist and subjected to a light exposure treatment before the developing processing, comprising:

the substrate table on which a substrate is disposed; and an electric field forming mechanism for forming an electric field capable of moving the protons in the portions of the resist corresponding to light-exposed regions formed on the substrate disposed on said substrate table.

23. The substrate processing apparatus according to claim 22, wherein said electric field forming mechanism includes an upper electrode arranged to face the front side of the substrate disposed on said substrate table, a lower electrode arranged on the back side of the substrate disposed on said substrate table in a manner to face the substrate, an electric field generating device for generating electric field by applying a voltage to said upper electrode and said lower electrode, and a controller for controlling said electric field generating device.

24. A substrate processing method for processing a substrate coated with a chemical amplification type resist and subjected to a light exposure treatment before the developing processing, comprising the steps of:

transferring the substrate onto a substrate table;

heating the substrate disposed on said substrate table; and forming an electric field in a manner to prevent the protons generated in the resist formed on the substrate from being scattered while the substrate is being heated.

25. A substrate processing method for processing a substrate coated with a chemical amplification type resist and subjected to a light exposure treatment before the developing processing, comprising the steps of:

transferring the substrate onto a substrate table;

heating the substrate disposed on said substrate table; and forming an electric field in a manner to exert force, which is directed toward the substrate, on the protons generated in the resist formed on the substrate while the substrate is being heated.

26. A substrate processing method for processing a substrate coated with a chemical amplification type resist and subjected to a light exposure treatment before the developing processing, comprising the steps of:

transferring the substrate onto a substrate table;

heating the substrate disposed on said substrate table; and forming an electric field in a manner to exert force, which is directed upward, on the protons generated in the resist formed on the substrate while the substrate is being heated.

27. A substrate processing method for processing a substrate coated with a chemical amplification type resist and subjected to a light exposure treatment before the developing processing, comprising the steps of:

transferring the substrate onto a substrate table;

heating the substrate disposed on said substrate table;

forming a purge gas stream along the substrate; and charging positive said purge gas stream.

28. A substrate processing method for processing a substrate coated with a chemical amplification type resist and subjected to a light exposure treatment before the developing processing, comprising the steps of:

transferring the substrate onto a substrate table;

forming an electric field serving to control the distribution of the protons present in a light-exposed portion of the resist formed on the substrate; and heating the substrate after the distribution of the protons is controlled by said electric field.

29. The substrate processing method according to claim 28, wherein the distribution of the protons present in the light-exposed portion of the resist formed on the substrate is made uniform by the step of forming said electric field.

30. A substrate processing method for processing a substrate coated with a chemical amplification type resist and subjected to a light exposure treatment before the developing processing, comprising the steps of:

transferring the substrate onto a substrate table; and forming an electric field for moving the protons present in portions of the resist corresponding to light-exposed regions formed on the substrate within the portions.

* * * * *